(12) United States Patent
Uliel et al.

(10) Patent No.: US 11,995,848 B2
(45) Date of Patent: May 28, 2024

(54) IMAGE GENERATION FOR EXAMINATION OF A SEMICONDUCTOR SPECIMEN

(71) Applicant: Applied Materials Israel Ltd., Rehovot (IL)

(72) Inventors: David Uliel, Tel-Mond (IL); Yan Avniel, Rehovot (IL); Bobin Mathew Skaria, Kasturi Nagar (IN); Oz Fox-Kahana, Rehovot (IL); Gal Daniel Gutterman, Meitar (IL); Atai Baldinger, Tel Aviv (IL); Murad Muslimany, Nazareth (IL); Erez Lidor, Yavne (IL)

(73) Assignee: Applied Materials Israel Ltd., Rehovot (IL)

(*) Notice: Subject to any disclaimer, the term of this patent is extended or adjusted under 35 U.S.C. 154(b) by 456 days.

(21) Appl. No.: 17/209,086

(22) Filed: Mar. 22, 2021

(65) Prior Publication Data
US 2022/0301196 A1   Sep. 22, 2022

(51) Int. Cl.
*G06K 9/00* (2022.01)
*G06F 18/22* (2023.01)
(Continued)

(52) U.S. Cl.
CPC ............... *G06T 7/30* (2017.01); *G06F 18/22* (2023.01); *G06T 5/50* (2013.01); *G06T 7/001* (2013.01);
(Continued)

(58) Field of Classification Search
CPC .. G06T 7/30; G06T 5/50; G06T 7/001; G06T 2207/20221; G06T 2207/30148;
(Continued)

(56) References Cited

U.S. PATENT DOCUMENTS

| 10,446,367 B2 | 10/2019 | Xiao | |
|---|---|---|---|
| 2005/0006583 A1* | 1/2005 | Nozoe | G01N 23/20 250/311 |

(Continued)

OTHER PUBLICATIONS

Liu, Xifeng, and Yuwei Hu. "Inspection of IC Wafer Defects Based on Image Registration." 2018 IEEE 3rd Advanced Information Technology, Electronic and Automation Control Conference (IAEAC). IEEE, 2018. (Year: 2018).*

*Primary Examiner* — Andrew M Moyer
(74) *Attorney, Agent, or Firm* — Lowenstein Sandler LLP

(57) ABSTRACT

There is provided a system and method of examination of a semiconductor specimen, comprising: obtaining a sequence of frames of an area of the specimen acquired by an electron beam tool configured to scan the area from a plurality of directions, the sequence comprising a plurality of sets of frames each acquired from a respective direction; and registering the plurality of sets of frames and generating an image of the specimen based on result of the registration, comprising: performing, for each direction, a first registration among the set of frames acquired therefrom, and combining the registered set of frames to generate a first composite frame, giving rise to a plurality of first composite frames respectively corresponding to the plurality of directions; and performing a second registration among the plurality of first composite frames, and combining the registered plurality of first composite frames to generate the image of the specimen.

19 Claims, 7 Drawing Sheets

(51) Int. Cl.
  *G06T 5/50* (2006.01)
  *G06T 7/00* (2017.01)
  *G06T 7/30* (2017.01)
  *H01J 37/26* (2006.01)

(52) U.S. Cl.
  CPC .. *H01J 37/261* (2013.01); *G06T 2207/20221* (2013.01); *G06T 2207/30148* (2013.01); *H01J 2237/221* (2013.01)

(58) Field of Classification Search
  CPC ............ G06T 7/33; G06T 2207/10061; G06T 7/0004; G06T 7/97; G06T 7/174; G06T 5/006; G06F 18/22; H01J 37/261; H01J 2237/221; H01J 2237/2814; H01J 37/222; H01J 37/28; H01J 2237/004; G06V 10/74; G06V 10/10; H01L 22/10
  See application file for complete search history.

(56) References Cited

U.S. PATENT DOCUMENTS

| | | | |
|---|---|---|---|
| 2015/0086105 A1* | 3/2015 | Maxwell | H01L 31/1876 382/141 |
| 2019/0005629 A1* | 1/2019 | Sharma | G06T 3/4053 |
| 2019/0279841 A1* | 9/2019 | Xiao | G03F 7/70683 |
| 2022/0207699 A1* | 6/2022 | Kang | G06T 7/30 |
| 2022/0392793 A1* | 12/2022 | Buxbaum | G06T 7/50 |

\* cited by examiner

IMAGE GENERATION FOR EXAMINATION OF A SEMICONDUCTOR SPECIMEN

TECHNICAL FIELD

The presently disclosed subject matter relates, in general, to the field of examination of a semiconductor specimen, and more specifically, to generation of an image usable for examination of the semiconductor specimen.

BACKGROUND

Current demands for high density and performance associated with ultra large-scale integration of fabricated devices require submicron features, increased transistor and circuit speeds, and improved reliability. As semiconductor processes progress, pattern dimensions such as line width, and other types of critical dimensions, are continuously shrunken. Such demands require formation of device features with high precision and uniformity, which, in turn, necessitates careful monitoring of the fabrication process, including automated examination of the devices while they are still in the form of semiconductor wafers.

Examination can be provided by using non-destructive examination tools during or after manufacture of the specimen to be examined. Examination generally involves generating certain output (e.g., images, signals, etc.) for a specimen by directing light or electrons to the wafer and detecting the light or electrons from the wafer. A variety of non-destructive examination tools includes, by way of non-limiting example, scanning electron microscopes, atomic force microscopes, optical inspection tools, etc.

Examination processes can include a plurality of examination steps. During the manufacturing process, the examination steps can be performed a multiplicity of times, for example after the manufacturing or processing of certain layers, or the like. Additionally or alternatively, each examination step can be repeated multiple times, for example for different wafer locations, or for the same wafer locations with different examination settings.

Examination processes are used at various steps during semiconductor fabrication to detect and classify defects on specimens, as well as perform metrology related operations. Effectiveness of examination can be increased by automatization of process(es) as, for example, defect detection, Automatic Defect Classification (ADC), Automatic Defect Review (ADR), automated metrology-related operations, etc.

SUMMARY

In accordance with certain aspects of the presently disclosed subject matter, there is provided a computerized system of examination of a semiconductor specimen, the system comprising a processing and memory circuitry (PMC) configured to: obtain a sequence of frames of an area of the semiconductor specimen, the sequence of frames being acquired by an electron beam tool configured to scan the area from a plurality of directions, the sequence of frames comprising a plurality of sets of frames wherein each set of frames is acquired from a respective direction; and register the plurality of sets of frames and generate an image of the semiconductor specimen based on result of the registration, comprising: in response to a determination of performing a first registration among the set of frames acquired from each direction, performing, for each direction, the first registration among the set of frames acquired therefrom and combining the registered set of frames to generate a first composite frame, thereby giving rise to a plurality of first composite frames respectively corresponding to the plurality of directions; and performing a second registration among the plurality of first composite frames and combining the registered plurality of first composite frames to generate the image of the area of the semiconductor specimen; wherein the generated image possesses reduced image artifacts with respect to a frame scanned from a given direction of the plurality of directions, and wherein the image is usable for examination of the semiconductor specimen.

In addition to the above features, the system according to this aspect of the presently disclosed subject matter can comprise one or more of features (i) to (xii) listed below, in any desired combination or permutation which is technically possible:

(i). The registering the plurality of sets of frames and generating an image of the semiconductor specimen can further comprise, in response to a determination of not performing the first registration, for each direction, combining the set of frames acquired therefrom to generate a second composite frame, thereby giving rise to a plurality of second composite frames respectively corresponding to the plurality of directions; and performing the second registration among the plurality of second composite frames and combining the registered plurality of second composite frames to generate the image of the semiconductor specimen.

(ii). The system can further comprise the electron beam tool.

(iii). The sequence of frames can be acquired by scanning the area sequentially from the plurality of directions, and obtaining one or more frames from each direction during every scanning.

(iv). The electron beam tool can be configured to compensate at least part of an offset between frames acquired from different directions by adjusting synchronization between a scanning process and an imaging process of the electron beam tool.

(v). The determination can be based on at least one of the following factors: the number of frames included in the set of frames, and a layer and/or material of the specimen to be examined.

(vi). The first registration can be performed to correct drifts between the set of frames acquired from each direction caused by one or more physical effects between the electron beam of the electron beam tool and the semiconductor specimen.

(vii). The one or more physical effects can be selected from a group comprising thermal expansion, charging effect, and tool tolerance.

(viii). The first registration can comprise performing pattern matching between the set of frames using a normalized cross-correlation function.

(ix). A search range used in a present frame during the pattern matching can be based on at least one previous drift identified in at least one preceding frame of the present frame.

(x). The second registration can be performed to correct offset between the plurality of first composite frames caused by scanning the area from the plurality of directions.

(xi). A search direction used in a present frame during a pattern matching performed in the second registration can be based on a direction of scanning when acquiring the present frame.

(xii). The plurality of directions can comprise two or more pairs of opposite directions, and the performing a second registration can comprise: for each given pair of opposite directions, registering two first composite frames corresponding to the opposite directions in the given pair, and combining the registered two first composite frames to obtain a composite frame, thereby giving rise to two or more composite frames corresponding to the two or more pairs of opposite directions; and registering the two or more composite frames and combining the registered two or more composite frames to generate the image of the semiconductor specimen.

In accordance with other aspects of the presently disclosed subject matter, there is provided a method of examination of a semiconductor specimen, the method performed by a processing and memory circuitry (PMC) and comprising: obtaining a sequence of frames of an area of the semiconductor specimen, the sequence of frames being acquired by an electron beam tool configured to scan the area from a plurality of directions, the sequence of frames comprising a plurality of sets of frames wherein each set of frames is acquired from a respective direction; and registering the plurality of sets of frames and generating an image of the semiconductor specimen based on a result of the registration, comprising: in response to a determination of performing a first registration among the set of frames acquired from each direction, performing, for each direction, the first registration among the set of frames acquired therefrom, and combining the registered set of frames to generate a first composite frame, thereby giving rise to a plurality of first composite frames respectively corresponding to the plurality of directions; and performing a second registration among the plurality of first composite frames and combining the registered plurality of first composite frames to generate the image of the area of the semiconductor specimen; wherein the generated image possesses reduced image artifacts with respect to a frame scanned from a given direction of the plurality of directions, and wherein the image is usable for examination of the semiconductor specimen.

This aspect of the disclosed subject matter can comprise one or more of features (i) to (xii) listed above with respect to the system, *mutatis mutandis*, in any desired combination or permutation which is technically possible.

In accordance with other aspects of the presently disclosed subject matter, there is provided a non-transitory computer readable medium comprising instructions that, when executed by a computer, cause the computer to perform a method of examination of a semiconductor specimen, the method comprising: obtaining a sequence of frames of an area of the semiconductor specimen, the sequence of frames being acquired by an electron beam tool configured to scan the area from a plurality of directions, the sequence of frames comprising a plurality of sets of frames wherein each set of frames is acquired from a respective direction; and registering the plurality of sets of frames and generating an image of the semiconductor specimen based on result of the registration, comprising: in response to a determination of performing a first registration among the set of frames acquired from each direction, performing, for each direction, the first registration among the set of frames acquired therefrom, and combining the registered set of frames to generate a first composite frame, thereby giving rise to a plurality of first composite frames respectively corresponding to the plurality of directions; and performing a second registration among the plurality of first composite frames, and combining the registered plurality of first composite frames to generate the image of the area of the semiconductor specimen; wherein the generated image possesses reduced image artifacts with respect to a frame scanned from a given direction of the plurality of directions, and wherein the image is usable for examination of the semiconductor specimen.

This aspect of the disclosed subject matter can comprise one or more of features (i) to (xii) listed above with respect to the system, *mutatis mutandis*, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
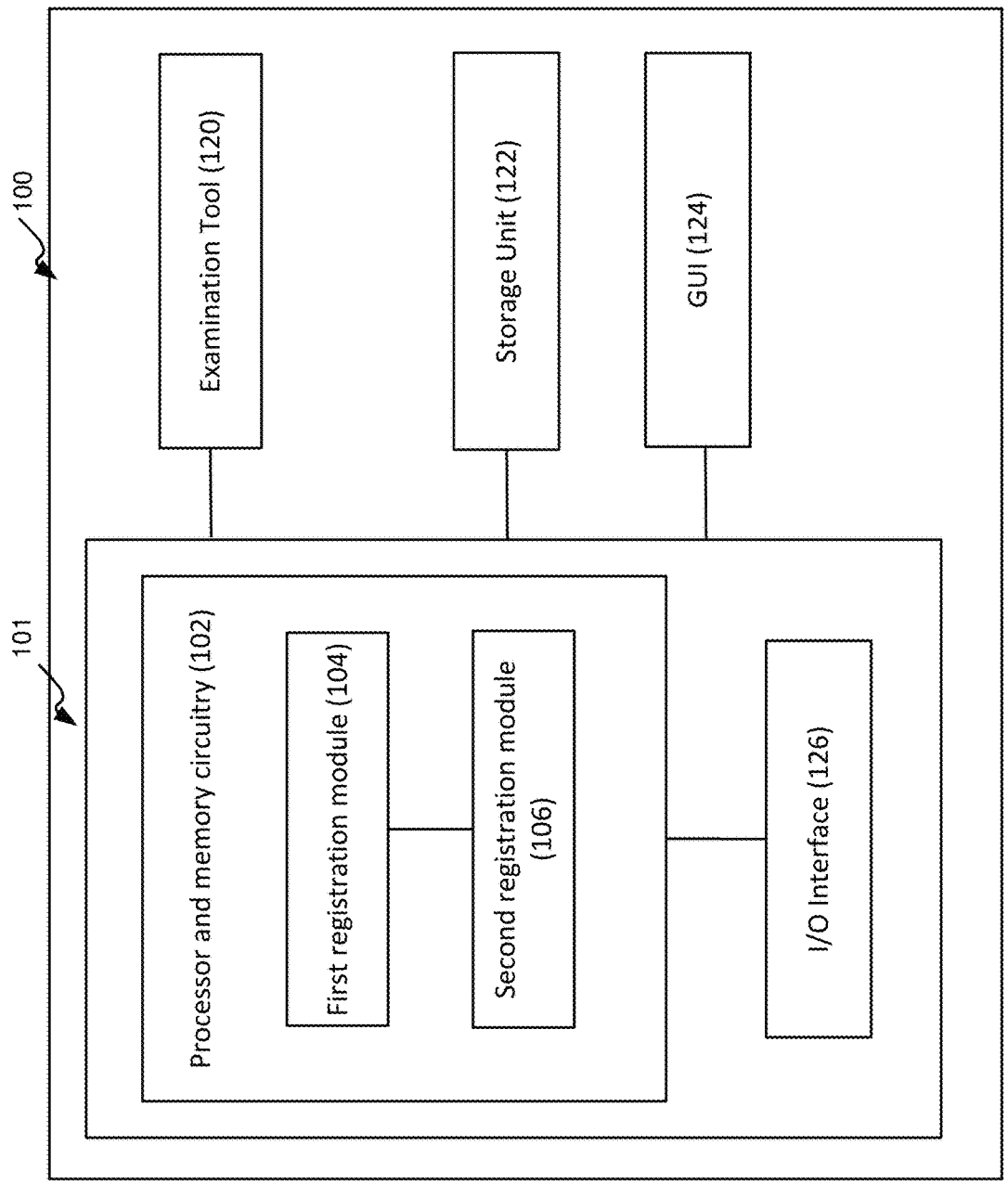
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "performing", "obtaining", "scanning", "determining", "acquiring", "registering", "generating", "combining", "compensating", "adjusting", "correcting", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the examination system, the image generation system and respective parts thereof disclosed in the present application.

The term "examination" used in this specification should be expansively construed to cover any kind of metrology-related operations, as well as operations related to detection and/or classification of defects in a specimen during its fabrication. Examination is provided by using non-destructive examination tools during or after manufacture of the specimen to be examined. By way of non-limiting example, the examination process can include one or more of the following operations: runtime scanning (in a single or in multiple scans), sampling, reviewing, measuring, classifying and/or other operations provided with regard to the specimen or parts thereof, using the same or different examination tools. Likewise, examination can be provided prior to manufacture of the specimen to be examined, and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

The term "metrology" used in this specification should be expansively construed to cover any kind of measuring characteristics and features in a specimen provided by using examination and/or metrology tools during or after manufacture of the specimen to be inspected. By way of non-limiting example, the metrology process can include generating a measurement recipe and/or performing runtime measurement, for example by scanning (in a single or in multiple scans), reviewing, measuring and/or other operations provided with regard to the specimen or parts thereof using the same or different tools. Measurement results such as measured images are analyzed for example, by employing image-processing techniques. Note that, unless specifically stated otherwise, the term "metrology" or derivatives thereof used in this specification are not limited with respect to measurement technology, measurement resolution or size of inspection area.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "defect" used in this specification should be expansively construed to cover any kind of abnormality or undesirable feature formed on or within a specimen.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter.

The examination system 100 illustrated in FIG. 1 can be used for examination of a semiconductor specimen (e.g., of a wafer and/or parts thereof) as part of the specimen fabrication process. According to certain embodiments of the presently disclosed subject matter, the illustrated examination system 100 comprises a computer-based system 101 capable of generating one or more images of the semiconductor specimen during specimen fabrication (referred to hereinafter as fabrication process (FP) images or just images, for brevity). The FP images are usable for examination of the semiconductor specimen. System 101 is also referred to herein as an image generation system.

As described above, the examination referred to herein can be construed to cover any kind of metrology-related operations, as well as operations related to detection and/or classification of defects in a specimen during its fabrication. By way of example, the generated FP image can be used for examination such as, e.g., defect detection, and/or Automatic Defect Review (ADR), and/or Automatic Defect Classification (ADC), and/or metrology-related operations. In some embodiments, system 101 can be configured to perform one or more metrology operations on the generated images. By way of example, the metrology operations can include critical dimension (CD) measurements with respect to a specimen or parts thereof. In such cases, system 101 is also referred to as a metrology system, which is a subsystem of the examination system 100.

System 101 can be operatively connected to one or more examination tools 120 configured to scan a semiconductor specimen and capture frames/images thereof for examination of the specimen. In some embodiments, at least one of the examination tools 120 has metrology capabilities and can be configured to perform metrology operations on the captured images. Such an examination tool is also referred to as a metrology tool.

The term "metrology operation" used in this specification should be expansively construed to cover any metrology operation procedure used to extract metrology information relating to one or more structural elements on a semiconductor specimen. By way of example, metrology information to be extracted can be indicative of one or more of the following: dimensions (e.g., line widths, line spacing, contact diameters, size of the element, edge roughness, gray level statistics, etc.), shapes of elements, distances within or between elements, related angles, overlay information associated with elements corresponding to different design levels, etc. In some embodiments, the metrology operations can include measurement operations, such as, e.g., critical dimension (CD) measurements performed with respect to certain structures on the specimen.

The term "examination tool(s)" used herein should be expansively construed to cover any tools that can be used in examination-related processes, including, by way of non-limiting example, imaging, scanning (in a single or in multiple scans), sampling, reviewing, measuring, classifying and/or other processes provided with regard to the specimen or parts thereof.

By way of example, a specimen can be examined by one or more low-resolution examination tools (e.g., an optical inspection system, low-resolution SEM, etc.). The resulting data (referred to as low-resolution image data), informative of low-resolution images of the specimen, can be transmitted—directly or via one or more intermediate systems—to system 101. Alternatively, or additionally, the specimen can be examined by a high-resolution tool (e.g., a Scanning Electron Microscope (SEM) or Atomic Force Microscopy (AFM) or Transmission Electron Microscope (TEM)). The resulting data (referred to as high-resolution image data), informative of high-resolution images of the specimen, can be transmitted—directly or via one or more intermediate systems—to system 101.

Without limiting the scope of the disclosure in any way, it should also be noted that the examination tools 120 can be implemented as examination machines of various types, such as optical imaging machines, electron beam machines, and so on. In some cases, the same examination tool can provide low-resolution image data and high-resolution image data.

According to certain embodiments, one of the examination tools is an electron beam tool, such as, e.g., scanning electron microscopy (SEM). SEM is a type of electron microscope that produces images of a specimen by scanning the surface with a focused beam of electrons. The electrons interact with atoms in the specimen, producing various signals that contain information on the surface topography and composition of the specimen. The position of the beam is combined with the intensity of the detected signal to produce an image. SEM is capable of accurately measuring features during the manufacture of semiconductor wafers. By way of example, the SEM tool can be critical dimension scanning electron microscopes (CD-SEM) used to measure critical dimensions of structural features in the images.

One of the problems in using SEM for CD metrology relates to charging effects. Semiconductor specimens collect charge when scanned by the electron beam, and the buildup of surface charge on a specimen caused by the electron beam may cause scanning faults and image artifacts, such as, e.g., gross image distortion and/or image obliteration. Such image artifacts can lead to an increasing inability to accurately measure critical integrated device dimensions in the semiconductor industry. Since CDs are becoming increasingly smaller as lithographic technology advances, charge buildup is expected to become a larger variable error component for CD-SEM metrology. The artifacts induced from the charging can be more significant relative to the dimensions and the feature edge profiles, and the inaccuracies caused by the image artifacts can pose a significant problem in the manufacture of integrated circuits.

In particular, scanning a specimen from a given direction (e.g., from left to right) can induce non-uniform charging of the specimen, which may influence the CD measurements. By way of example, assume there is a line structure in an area of the specimen. When scanning the area from one specific direction, e.g., from left to right, which is perpendicular to the longitudinal axis of the structure, the electron beam interacts differently with different surface structure and/or different materials, thus causing different local charging in the area. For instance, in some cases, the edge of the line structure will most likely emit more electrons, thus causing a positive charge on the surface. Due to the positive charge of the edge surface, when the beam moves along from the edge to the center of the line structure, and towards the other edge, at least part of the beam may be attracted by the neighboring edge surface which is positively charged, thus changing its original route and being re-directed to the neighboring surface other than the originally targeted destination. In such cases, the amount of electrons that actually arrives at the target location would be different with respect to the amount that is originally supposed to arrive, thereby affecting the accuracy of the generated SEM signal for the target location. For instance, in an ideal situation, a SEM signal representing a line structure would typically have two peaks respectively representative of the two line edges. However, due to the local charging effect, the second peak (i.e., second as from the scanning direction) would appear with a reduced amplitude, and possibly some artifacts, as compared to the first peak.

Different measures for reducing the charging effects involve physically changing/transforming the feature to be measured, or creating a stack or coating that can neutralize the charge. However, these measures all require physical changes to the wafer structures which are complicated in implementations. According to certain embodiments of the presently disclosed subject matter, there is proposed an image generation method and system for reducing/eliminating the image artifacts caused by the charging effects, instead of attempting to eliminate the charging effects itself.

As illustrated in FIG. 1, system 101 includes a processor and memory circuitry (PMC) 102 operatively connected to a hardware-based I/O interface 126. PMC 102 is configured to provide processing necessary for operating the system as further detailed with reference to FIGS. 2A, 2B and 3, and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

According to certain embodiments, functional modules comprised in PMC 102 can include a first registration module 104 and a second registration module 106. The PMC 102 can be configured to obtain, via I/O interface 126, a sequence of frames of an area of the semiconductor specimen. The sequence of frames can be acquired by an electron beam tool (e.g., one of the examination tools 120) configured to scan the area from a plurality of directions. The sequence of frames comprise a plurality of sets of frames, where each set of frames is acquired from a respective direction. The PMC 102 can be configured to register the plurality of sets of frames and generate an image of the semiconductor specimen based on result(s) of the registration.

Specifically, the first registration module 104 can be configured to, in response to a determination of performing a first registration among the set of frames acquired from each direction, perform, for each direction, the first registration among the set of frames acquired therefrom, and combine the registered set of frames to generate a first composite frame, thereby giving rise to a plurality of first composite frames respectively corresponding to the plurality of directions.

The second registration module 106 can be configured to perform a second registration among the plurality of first composite frames and combine the registered plurality of first composite frames to generate the image of the area of the semiconductor specimen. The generated image, as resulted from the above process, possesses reduced image artifacts with respect to a frame scanned from a given direction of the plurality of directions. The image can be used for examination of the semiconductor specimen as described above.

Operations of system 101, PMC 102 and the functional modules therein, will be further detailed with reference to FIGS. 2A, 2B and 3.

According to certain embodiments, system 101 can comprise a storage unit 122. The storage unit 122 can be configured to store any data necessary for operating system 101, e.g., data related to input and output of system 101, as well as intermediate processing results generated by system 101. By way of example, the storage unit 122 can be configured to store the frames produced by the examination tool 120 and/or derivatives thereof. Accordingly, the frames can be retrieved from the storage unit 122 and provided to the PMC 102 for further processing.

In some embodiments, system 101 can optionally comprise a computer-based Graphical User Interface (GUI) 124 which is configured to enable user-specified inputs related to system 101. For instance, the user can be presented with a visual representation of the specimen (for example, by a display forming part of GUI 124), including frame/image data of the specimen. The user may be provided, through the GUI, with options of defining certain operation parameters. In some cases, the user may also view operation results, such as the generated image, and/or further examination results (e.g., measurements on the generated image) on the GUI.

As will be further detailed with reference to FIG. 2, system 101 is configured to receive, via I/O interface 126, a sequence of frames. The frames can include frame data (and/or derivatives thereof) produced by the examination tools 120 and/or frame data stored in one or more data depositories. Frame data can include one or more of the following: frames captured by the examination tools during the manufacturing process, frames derived from the captured frames as obtained by various pre-processing stages, and computer-generated design data-based frames (e.g., simulated frames, synthetic frames, etc.). It is noted that in some cases the frames can include frame data and associated numeric data (e.g., metadata, hand-crafted attributes, etc.). It is further noted that the frame data can include data related to a layer of interest and/or to one or more additional layers of the specimen.

System 101 is further configured to process the received frames and send, via I/O interface 126, the results or part thereof (e.g., the generated image, and/or CD measurements on the image) to the storage unit 122, and/or the examination tool 120.

In some embodiments, additionally to the examination tool 120, the examination system 100 can comprise one or more examination modules, such as, e.g., defect detection module and/or Automatic Defect Review Module (ADR) and/or Automatic Defect Classification Module (ADC) and/ or a metrology-related module and/or other examination modules which are usable for examination of a semiconductor specimen. The one or more examination modules can be implemented as stand-alone computers, or their functionalities (or at least part thereof) can be integrated with the examination tool 120. In some embodiments, the generated image as obtained from system 101 can be used by the examination tool 120 and/or the one or more examination modules (or part thereof) for further examination of the specimen.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules as comprised in the PMC 102 can be distributed over several local and/or remote devices, and can be linked through a communication network. It is further noted that in other embodiments at least some of the examination tool(s) 120, storage unit 122 and/or GUI 124 can be external to the examination system 100 and operate in data communication with system 101 via I/O interface 126. System 101 can be implemented as stand-alone computer(s) to be used in conjunction with the examination tools. Alternatively, the respective functions of the system 101 can, at least partly, be integrated with one or more examination tools 120, thereby facilitating and enhancing the functionalities of the examination tools 120 in examination-related processes.

Figure 2A:
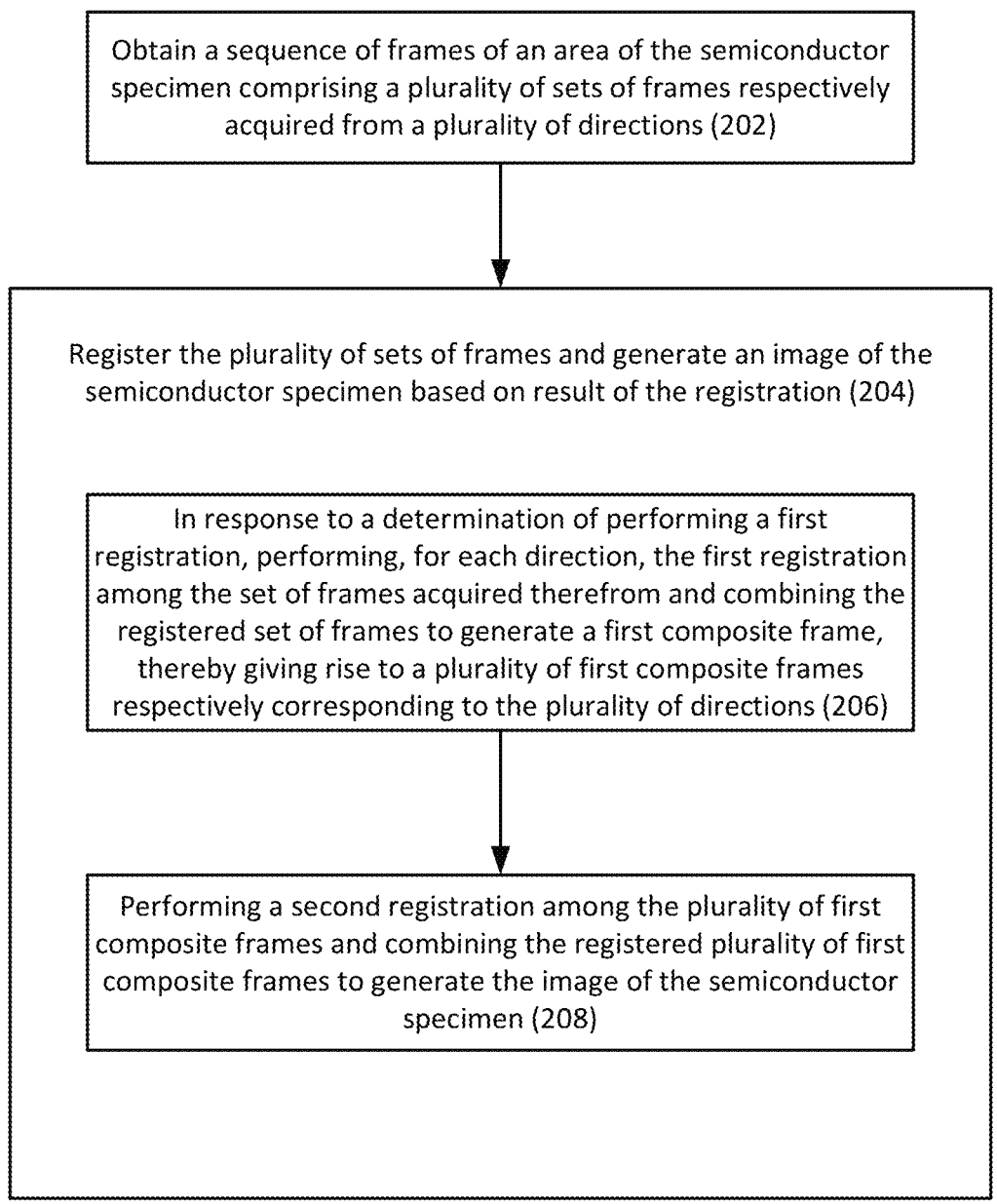
FIG. 2A illustrates a generalized flowchart of generating an image usable for examination of a semiconductor specimen in accordance with certain embodiments of the presently disclosed subject matter.
Figure 3:
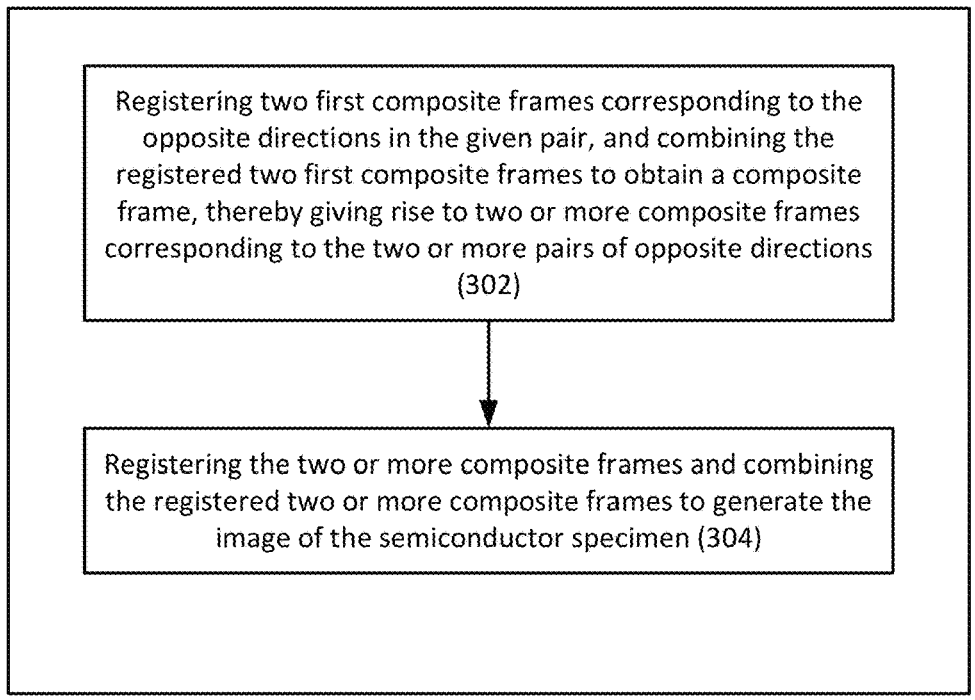
FIG. 3 illustrates a generalized flowchart of the second registration performed in a two-step registration process in accordance with certain embodiments of the presently disclosed subject matter.

Referring to FIG. 2A, there is illustrated a generalized flowchart of generating an image usable for examination of a semiconductor specimen in accordance with certain embodiments of the presently disclosed subject matter.

As described above, the charging effects on a specimen caused by the electron beam may cause scanning faults and image artifacts, such as, e.g., gross image distortion and/or image obliteration. Such image artifacts can affect the accuracy and effectiveness of examination of the specimen. For instance, scanning a specimen from a specific direction (e.g., from left to right) by an electron beam tool can induce non-uniform charging of the specimen, which may influence the accuracy of the CD measurements.

According to certain embodiments of the presently disclosed subject matter, there is proposed an image generation method and system for reducing/eliminating the image artifacts caused by the charging effects, thereby providing an image with reduced artifacts and feature uniformity, and, accordingly, improving the examination result of the specimen.

Specifically, a sequence of frames of an area of the semiconductor specimen can be obtained (202) (e.g., by the PMC 102 via I/O interface 126, from the examination tool(s) 120). The sequence of frames can be acquired by an electron beam tool configured to scan the area from a plurality of directions. By way of example, the sequence of frames can be SEM frames captured by a SEM tool. For instance, the SEM tool can be critical dimension scanning electron microscopes (CD-SEM) used to measure critical dimensions of structural elements/features in the image. The sequence of frames comprises a plurality of sets of frames, where each set of frames is acquired from a respective direction of the plurality of directions.

In some embodiments, the plurality of directions can include one or more pairs of opposite directions. A pair of opposite directions refer to two directions which are diametrically opposed to each other (e.g., 180 degrees one to the other), such as, e.g., a first direction of left to right, and a second direction of right to left, or a first direction of top to bottom, and a second direction of bottom to top. By way of example, in some cases, the plurality of directions include one pair of opposite directions. In such cases, the sequence of images are captured from two opposite directions, which is also referred to as a two-way scan. For instance, a first set of frames is acquired from the first direction (e.g., from left to right), and a second set of frames is acquired from the second direction (e.g., from right to left).

By way of another example, the plurality of directions can include multiple pairs of opposite directions. For instance, the sequence of images can be acquired from two pairs of opposite directions, the first pair between left and right, and the second pair between top and bottom. This is also referred to as a four-way scan. Accordingly, four sets of frames are acquired respectively from the four directions. Similarly, one or more additional pairs of directions can be added, such as, e.g., directions along the diagonal lines, etc., and, accordingly, additional sets of frames can be acquired from such directions. This way of scanning an area of the specimen from multiple directions can be generally referred to as an N-way scan (N≥2).

In some embodiments, it can be determined specifically how many directions (and which exact directions) are needed for scanning a given semiconductor specimen or an area thereof. By way of example, such determination can be made based on the specific layer of the specimen, and/or specific structural elements/features comprised in the target area of the specimen. For instance, a two-way scan can be sufficient for the structural elements such as, e.g., lines. In such cases, the frames can be acquired by scanning the area of the specimen from the directions that are normal/perpendicular to the main direction of the structural elements (e.g., the longitudinal axis of the lines). In another example, in cases where the structural elements include contacts which are in the shape of a circle, four-way scan or scan with even more directions can be used for compensating possible artifacts caused by charging effects resulting from different directions. Therefore, in some embodiments of the present disclosure, the proposed method can further comprise determining the plurality of directions used to scan the area of the specimen. By way of example, the determination can be made by the user as a manual configuration in the tool, or automatically by the system 101 as part of the image generation method. Alternatively, it can be a default determination, e.g., the system can by default always perform a two-way scan, or a four-way scan, etc. This default determination can thus be regarded as a pre-determination or pre-configuration of the system.

A structural element or feature used herein can refer to any original object on the specimen that has a geometrical shape or geometrical structure with a contour, in some cases combined with other object(s) (therefore forming a pattern). Examples of structural elements can include general shape features, including, such as, e.g., contacts, line structures, etc.

Figure 4:
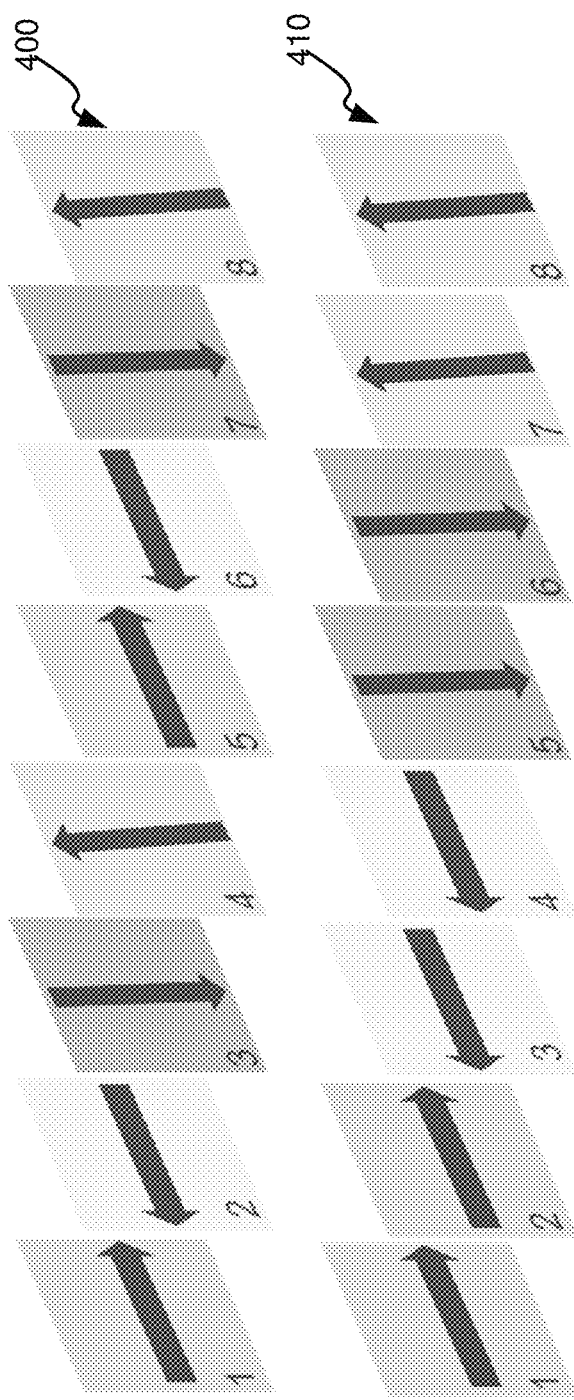
FIG. 4 illustrates examples of a sequence of frames of a target area on a specimen in accordance with certain embodiments of the presently disclosed subject matter.

Referring to FIG. 4 now, there are illustrated examples of a sequence of frames of a target area on a specimen in accordance with certain embodiments of the presently disclosed subject matter.

According to certain embodiments, the sequence of frames can be acquired by scanning the area sequentially from the plurality of directions, and obtaining one or more frames from each direction during every scanning. FIG. 4 illustrates examples of a sequence of frames acquired in a four-way scan, including a first pair of directions of left to right and right to left, and a second pair of directions of top to bottom and bottom to top. Specifically, 400 illustrates an example where the target area of the specimen is scanned sequentially from the four directions, and every time one frame is acquired from each direction. As shown, frame 1 is acquired from a first direction of left to right, frame 2 is acquired from a second direction of right to left, frame 3 is acquired from a third direction of top to bottom, and frame 4 is acquired from a fourth direction of bottom to top. Then the sequence continues in a similar manner and frames 5-8 repeat in this order.

410 illustrates another example where the target area of the specimen is scanned sequentially from the four directions, and every time two frames are acquired from each direction. As shown, frames 1 and 2 are acquired from the first direction of left to right, frames 3 and 4 are acquired from the second direction of right to left, frames 5 and 6 are acquired from the third direction of top to bottom, and frames 7 and 8 are acquired from the fourth direction of bottom to top.

Different order of scanning may have different advantages, one with respect to another. For instance, when scanning in a manner as illustrated in 400, the charges can be expected to spread more uniformly across the surface of the specimen, thus being beneficial for reducing the accumulated charging effects as well as the image artifacts caused thereby, whereas scanning in a manner as illustrated in 410 can reduce the amount of drifts between the two frames captured from each direction (as they are captured, as neighboring frames thus do not suffer from multiple drifts).

Although, for illustrative purposes, only eight frames are illustrated in the sequences of the examples, it is understood that the sequence in either example can continue in a similar repetitive manner. It is also to be understood that the number of frames to be acquired from each direction in every scan is not limited to one or two frames as illustrated in the examples. The order of scanning with respect to the plurality of directions may also vary from the above illustrated, and may have different advantages with respect to the above described. Accordingly, any other suitable number of frames in combination with different scanning order can be adapted and applied in the present disclosure.

Continuing with the description of FIG. 2, the sequence of frames, which includes the plurality of sets of frames acquired from the plurality of directions, can be registered and an image of the semiconductor specimen can be generated (204) (e.g., by the PMC 102) based on results of the registration. In some embodiments, the registration can include a first registration among the frames in each set of frames acquired from each direction, and a second registration among the frames (i.e., the registered and combined frames) from the plurality of directions. In some cases, the first registration can be optional. For instance, it can be determined whether the first registration is required to be performed, as will be described in further detail below.

According to certain embodiments, in response to a determination of performing the first registration among the set of frames acquired from each direction, the first registration can be performed (206) (e.g., by the first registration module 104 as comprised in the PMC 102) for each direction, among the set of frames acquired therefrom, giving rise to a registered set of frames. The registered set of frames can be combined (206) to generate a first composite frame for each direction. Therefore, a plurality of first composite frames can be obtained respectively corresponding to the plurality of directions.

According to certain embodiments, the first registration is performed for the purpose of correcting drifts between the frames in the set of frames acquired from a given direction, the drifts caused by one or more physical effects between an electron beam of the electron beam tool and the semiconductor specimen. By way of example, the one or more physical effects can be selected from a group comprising thermal expansion, charging effect, and tool tolerance.

Thermal expansion refers to the physical phenomenon that when a semiconductor specimen, such as a wafer, is placed on the inspection stage located in a chamber where a steady temperature is kept, and is scanned by the electron beam, the wafer is continuously heated, which causes a physical expansion of the wafer surface. Such thermal expansion can cause the original target location of the beam to be drifted. Charging effects, as described above, refers to the physical phenomenon of buildup of surface charge on a specimen caused by the interaction between the electron beam and the specimen. Due to the continuous scanning process, the surface of the entire area is charged in an ongoing manner (this is also referred to as area charging, with respect to the local charging as described above), thus affecting at least part of the beam's actual destination on the specimen which causes the drifts between the frames. Tool tolerance refers to certain physical variances related to the electron beam tool itself, or variances between different tools. For instance, in some cases, there may be particles on the tool during the scan, and/or there may be mechanical differences of the parts assembly, factors which may, either together or separately, lead to drifts between the frames.

It is to be noted that the above physical effects are listed for illustrative and exemplary purposes only and should not be deemed as limiting the scope of the present disclosure in any way. In different embodiments, other physical effects that may cause possible drifts can be applied in addition to, or in lieu of the above.

In some embodiments, the first registration can comprise performing pattern matching between the frames in the set of frames acquired from a given direction. Pattern matching generally refers to checking for the presence of constituents of a certain pattern or structure. For instance, pattern matching can be performed by identifying a specific structural element or pattern in a first frame of the set, and searching the identified pattern in each remaining frame of the set. Pattern matching can be performed in different ways using a variety of algorithms. By way of example, a normalized cross-correlation function can be used in the present disclosure to extrapolate or predict the expected location of the pattern.

In some cases, the search range (e.g., the search radius and/or search direction) used in a present frame during the pattern matching, for the purpose of finding a matched pattern, can be based on at least one previous drift identified in at least one preceding frame of the present frame. For instance, assume a set of frames acquired from a given direction comprises four frames. A specific structural element (e.g., a line, a contact, or at least part thereof) is identified in the first frame. When searching the specific element in the second frame, a search range, including the search radius and/or search direction, can be defined, e.g., either by default or by the user, since there is no reference drift to be taken into consideration. Once the element is found in the second frame, a first drift between the two frames (in terms of relative distance and direction between the locations of the element in the first frame and the second frame) can be recognized. When searching the same structural element in the third frame, the first drift can be used as a reference when determining the specific search range therein. Similarly, when searching the same element in the fourth frame, the first drift and/or the second drift can be taken as the references for determining the search range, thus enabling a more efficient and accurate search.

Once the first registration is performed, a registered set of frames is obtained for each direction. The registered set of frames can be combined to generate a first composite frame for each direction. Therefore, a plurality of first composite frames can be obtained respectively corresponding to the plurality of directions. The combination of the frames can be performed in various ways. By way of example, the registered set of frames can be combined by summing the registered frames, optionally with averaging and/or applying weights to the frames during the summation.

A second registration can be performed (208) (e.g., by the second registration module 106 as comprised in the PMC 102) among the plurality of first composite frames, giving rise to a registered plurality of first composite frames. The registered plurality of first composite frames can be combined (208) to generate an image of the area of the semiconductor specimen. The image resulting from the above process possesses reduced image artifacts (e.g., caused by non-uniform charging of the specimen when being scanned from one direction) with respect to a frame scanned from a given direction of the plurality of directions. Such a generated image can be used for examination of the semiconductor specimen.

According to certain embodiments, the second registration is performed for the purpose of correcting the offset between the plurality of first composite frames caused by scanning the area from the plurality of directions. The offset caused by the directional scanning may relate to the scanning mechanism of the electron beam tool. By way of example, scanning from different directions may be implemented with different scanning coils in the tool, and there may exist process delays between the scanning coils which can be transformed into such offset. For instance, when starting the scanning in a given direction, there is always an acceleration phase when the beam starts to gain speed from being static, which causes delay of the formed signals. The signals acquired during the acceleration phase, when scanning from different directions, reside at different sides of the formed frames, thus causing the offset between the frames acquired from different directions. It is to be noted that this is only one example of such physical phenomena which can cause the offset between the frames acquired from different directions, and the present disclosure is not limited to any specific factor or phenomenon that causes the offset.

The second registration can be performed in a similar manner as the first registration, e.g., by performing pattern matching between the plurality of first composite frames corresponding to the plurality of directions. Pattern matching can be performed in a similar manner as described above with reference to block 206. Specifically, in some embodiments, a search direction used in a present frame during the pattern matching, for the purpose of finding a matched pattern, can be based on the direction of scanning when acquiring the present frame.

By way of example, assume four first composite frames corresponding to four scanning directions are acquired after the first registration. When searching a specific pattern in one of the frames, a preferred search direction can be defined based on the scanning direction from which the specific composite frame is generated. For instance, if a first composite frame is generated based on a set of frames acquired from a first direction (e.g., left to right), the preferred search direction in such frame can be defined to be consistent with the first direction. For instance, the search radius set for the X direction (e.g., left-right dimension) can be larger with respect to the search radius set for the Y direction (e.g., top-bottom dimension).

In some embodiments, the plurality of directions can comprise two or more pairs of opposite directions. In such cases, the second registration can be performed in a two-step registration process, as illustrated in FIG. 3. Specifically, for each given pair of opposite directions, two first composite frames corresponding to the opposite directions in the given pair can be registered. The registered two first composite frames can be combined (302) to obtain a composite frame, thereby giving rise to two or more composite frames corresponding to the two or more pairs of opposite directions. The two or more composite frames can be registered, and the registered two or more composite frames can be combined (304) to generate the image of the semiconductor specimen, as will be exemplified below with reference to FIG. 6.

Figure 7:
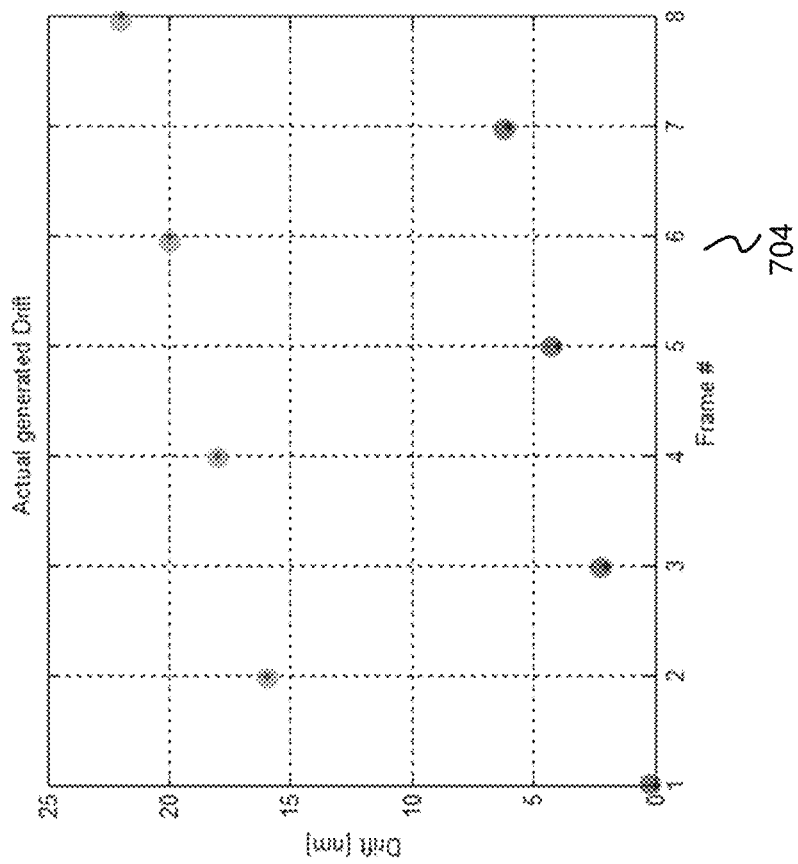
FIG. 7 illustrates two graphs exemplifying the drifts and offsets between the frames in accordance with certain embodiments of the presently disclosed subject matter.
Figure 7:
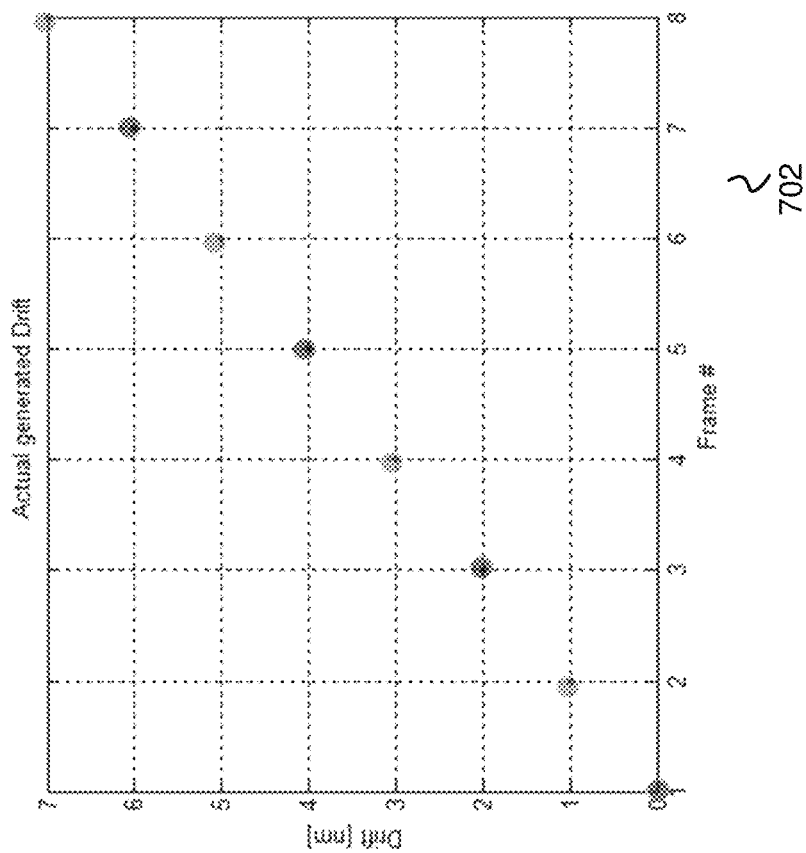

Referring to FIG. 7 now, there are illustrated two graphs exemplifying the drifts and offsets between the frames in accordance with certain embodiments of the presently disclosed subject matter.

As shown, 702 illustrates a graph of one-way scan of a specimen, i.e., scanning the specimen from only one given direction. A set of frames including eight frames are acquired from the given direction. The X axis of the graph represents frame numbers of the eight frames in the set, e.g., frames 1-8. The Y axis represents the amount of drifts caused between frames in the set. As described above, drifts between the frames in the set can be caused by one or more physical effects between the electron beam of the electron beam tool and the specimen, such as, e.g., thermal expansion, charging effect, and tool tolerance, etc. In some cases, the drifts between the frames appear to be in a linear relationship. This is particularly true when the drifts are caused at least partially by the effect of thermal expansion. As represented in graph 702, the amount of drift with respect to each specific frame forms a linear regression.

On the other hand, 704 illustrates a graph of a two-way scan of the specimen, i.e., scanning the specimen from two directions (e.g., a pair of opposite directions). A sequence of eight frames are acquired, including two sets of frames, where each set includes four frames acquired from a respective direction. Specifically, the specimen is scanned sequentially from the two directions, similarly as illustrated in 400 of FIG. 4. Therefore, a first set of frames including frames 1, 3, 5, and 7 is acquired from the first direction, and a second set of frames including frames 2, 4, 6 and 8 is acquired from the second direction. Since each set of frames collect every second frame in the sequence, the amount of drift between every two neighboring frames in a set in the two-way scan is expected to double the amount of drift between every two neighboring frames in the set of one-way scan. For instance, the drift between frames 1 and 2 in graph 702 is about 1 nm, whereas the drift between frames 1 and 3 in graph 704 is about 2 nm.

Therefore, when performing the first registration, for purpose of correcting such drifts, the search radius used in pattern matching should be defined accordingly. For instance, in a two-way scan, the search radius should be at least twice with respect to the search radius of the one-way scan, and, in a four-way scan, the search radius should be at least four times with respect to the search radius of the one-way scan.

As described above, the second set of frames as illustrated in graph 704 includes frames 2, 4, 6 and 8 which are acquired from the second direction. As shown, there is an offset between the amount of drifts of the second set of frames with respect to the amount of drifts of the first set of frames. For instance, the offset between the drift of frame 1 (acquired from the first direction) and the drift of frame 2 (acquired from the second direction) is about 16 nm, and the same applies to the offset between frame 3 and frame 4. This offset between frames acquired from different directions, as described above, can be caused by directional scanning (i.e., scanning the specimen from different directions) which may relate to the scanning mechanism of the electron beam tool. The second registration, as described above, is for the purpose of correcting such offset.

As illustrated in FIG. 7, the offset between frames acquired from different directions can be much larger with respect to the drifts between frames acquired from the same direction. Therefore, in some cases, different measures can be taken for compensating such offsets, in addition to, or in lieu of the second registration. According to certain embodiments, a tool configuration optimization can be performed for addressing this issue. As known, the electron beam tool can be generally recognized as comprising, among others, a scanning module and an imaging module. The scanning module can be configured to physically scan the surface of the specimen using the electron beam, causing the signals to be detected based on the electrons emitted from the specimen. The imaging module can be configured to transform the detected signals to a digital form which can be represented by the frames. The two modules are normally required to be exactly synchronized so that the generated frame can accurately reflect the generated signals.

In some embodiments of the present disclosure, it is proposed to adjust/adapt the synchronization between the scanning process and the imaging process accordingly so as compensate at least part of the offset between frames acquired from different directions. The exact adjustment or adaptation can be based on offset data obtained from reference specimens.

For instance, in the example of graph 704 of FIG. 7, the second set of frames may be imaged with a pre-configured delay with respect to the generated signals from the scanning process, whereas for the first set of frames, no delay is required. Similarly, in the example of FIG. 4, when there are four sets of frames acquired from four directions, the delay between the imaging process and the scanning process can be configured differently for generating different sets of frames.

According to certain embodiments, when performing registration of the plurality of sets of frames acquired from the plurality of directions and the generation of an image of the semiconductor specimen, as described with respect to block 204 in FIG. 2A, an alternative process can be implemented instead of steps 206 and 208. This is relevant when it is determined, in some cases, not to perform the first registration, as will be described in detail with respect to FIG. 2B.

Figure 2B:
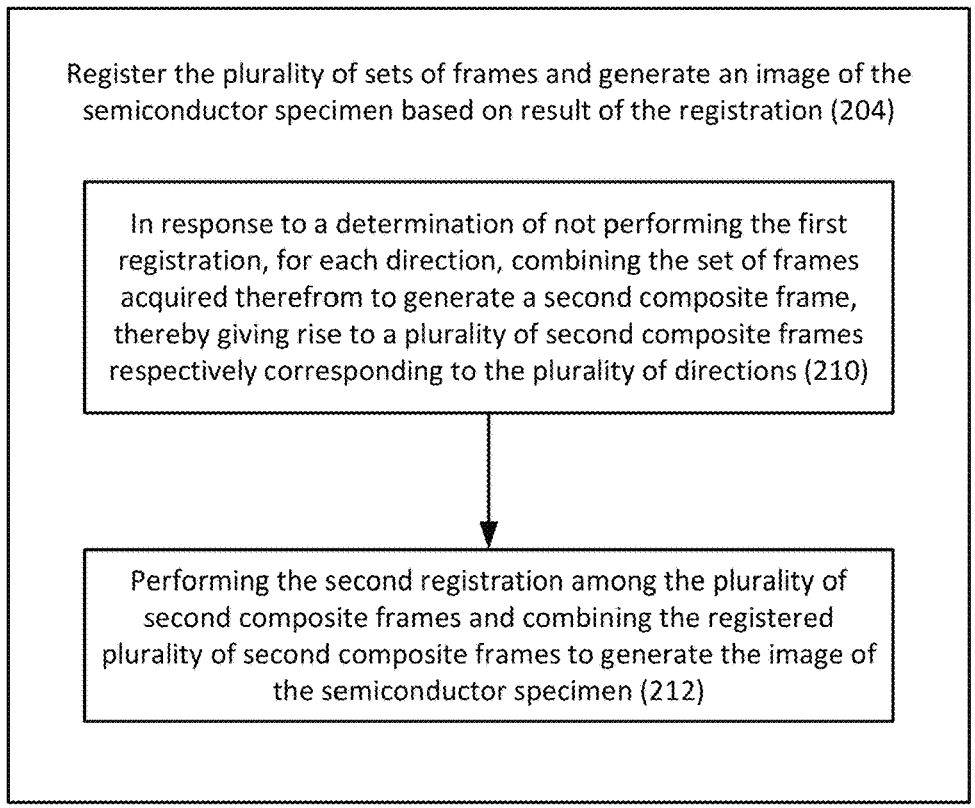
FIG. 2B illustrates a generalized flowchart of an alternative process of frame registration and image generation in accordance with certain embodiments of the presently disclosed subject matter.

Turning now to FIG. 2B, there is illustrated a generalized flowchart of an alternative process of frame registration and image generation in accordance with certain embodiments of the presently disclosed subject matter.

As described above, in some embodiments, a determination can be made to decide whether to perform the first registration or not. By way of example, the determination can be based on at least one of the following factors: the number of frames included in the set of frames, and a layer (as a fabrication step in the fabrication process) and/or material of the specimen to be examined. For instance, in some cases, only one frame is acquired from each direction, i.e., each set of frames includes a single frame. In such cases, there is no need to perform the first registration within each set of frames. In another example, certain layers of the specimen may not suffer from the issue of drifts due to the physical properties thereof, such as, e.g., the material, charging, temperature, etc. of the layers. In some cases, the layer and/or the material of the specimen can be used together or separately for determining the necessity to perform the first registration.

It is to be noted that the determination as referred to herein with respect to the first registration can be made automatically by the system 101 (e.g., as a part of the proposed method), or manually by a user (e.g., as a tunable system configuration). Alternatively, it can be a default determination, i.e., the system can by default always perform the first registration, or by default does not perform the first registration. This default determination can thus be regarded as a pre-determination or pre-configuration of the system.

According to certain embodiments, in response to a determination of not performing the first registration, the set of frames acquired from each direction can be combined (210) to generate a second composite frame, thereby giving rise to a plurality of second composite frames respectively corresponding to the plurality of directions. The second registration can be performed among the plurality of second composite frames and the registered plurality of second composite frames can be combined (212) to generate the image of the semiconductor specimen.

Figure 5:
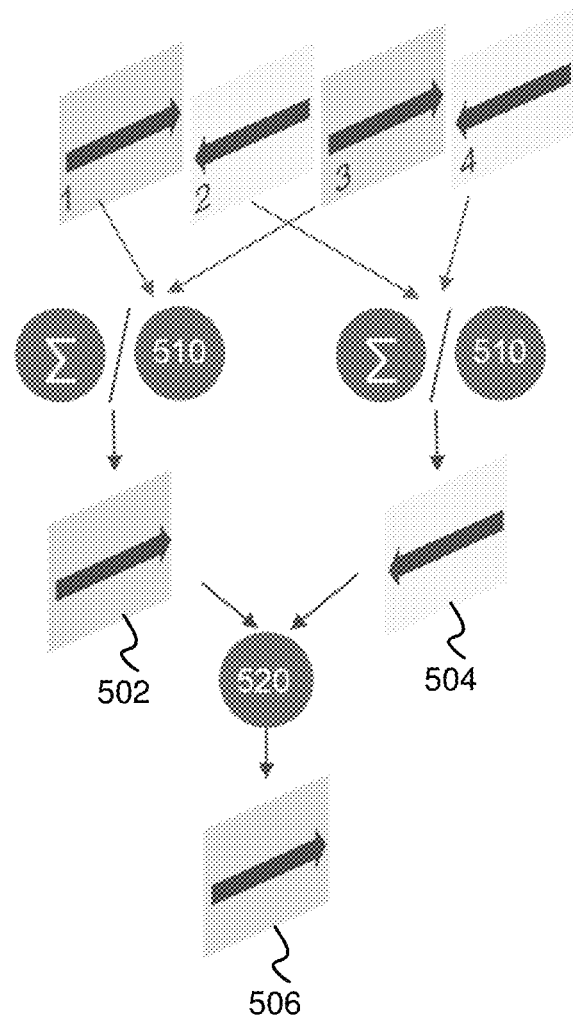
FIG. 5 illustrates a schematic diagram of the image generation process in a two-way scan in accordance with certain embodiments of the presently disclosed subject matter.

FIG. 5 illustrates a schematic diagram of the image generation process in a two-way scan in accordance with certain embodiments of the presently disclosed subject matter.

As exemplified, a sequence of four frames (frames 1-4) are acquired, including two frames (frames 1 and 3) acquired from a first direction (e.g., from left to right), and two frames (frames 2 and 4) acquired from a second direction (e.g., from right to left). A determination can be made whether to perform the first registration 510 for frames acquired from the same direction. In response to a positive determination, frames 1 and 3 are registered, and the registered two frames are combined to generate a composite frame 502 (termed as a first composite frame as described above when first registration is performed). Similarly, frames 2 and 4 are registered, and the registered two frames are combined to generate a composite frame 504. Alternatively, in response to a negative determination, frames 1 and 3 are just combined (e.g., summed) to generate a composite frame 502 (termed as a second composite frame as described above when first registration is not performed). Similarly, frames 2 and 4 are combined to generate a composite frame 504. A second registration 520 is then performed for the two composite frames 502 and 504, and the registered two composite frames are combined to generate image 506 of the specimen.

Figure 6:
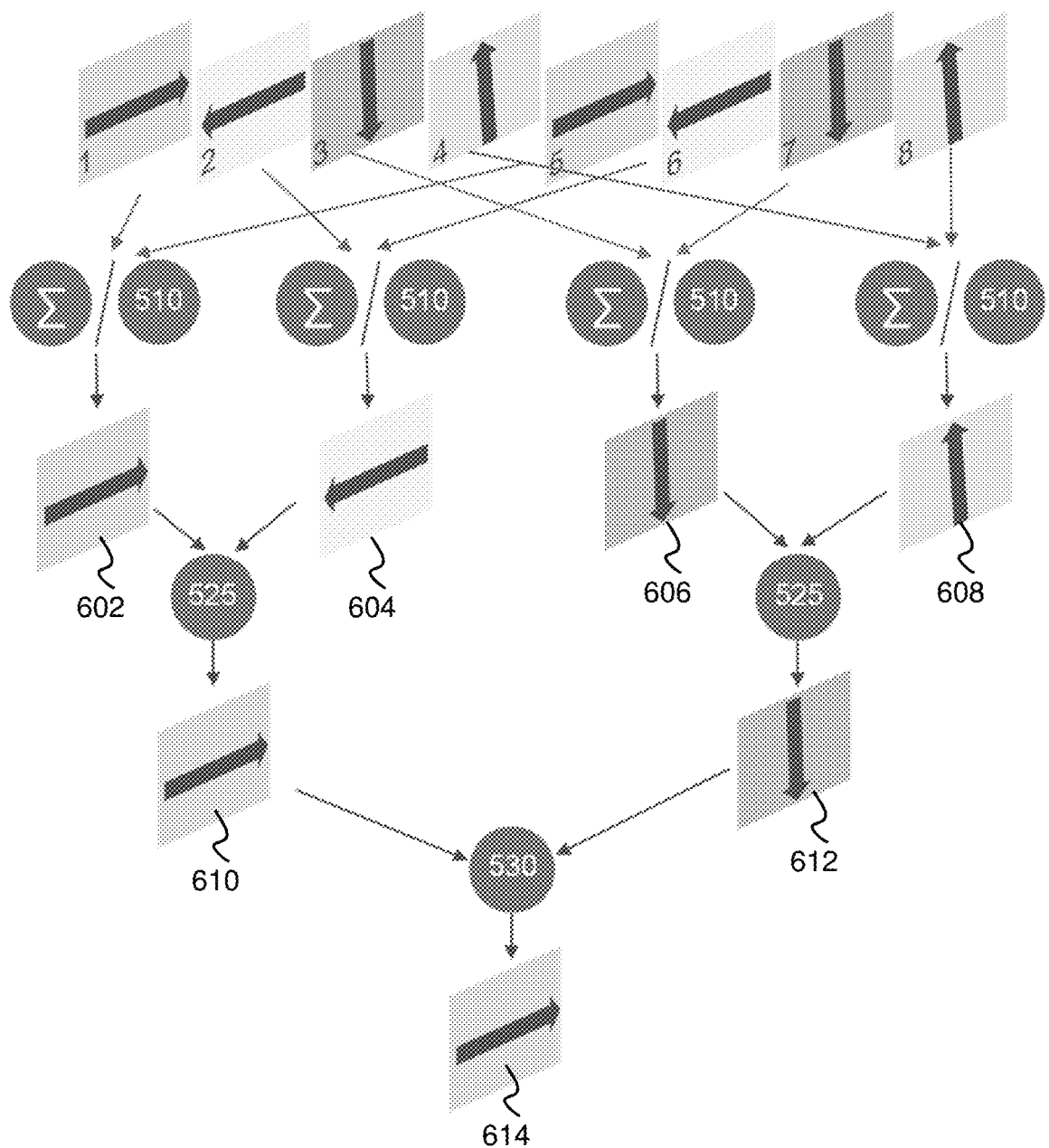
FIG. 6 illustrates a schematic diagram of the image generation process in a four-way scan in accordance with certain embodiments of the presently disclosed subject matter.

FIG. 6 illustrates a schematic diagram of the image generation process in a four-way scan in accordance with certain embodiments of the presently disclosed subject matter.

As exemplified, a sequence of eight frames (frames 1-8) are acquired by scanning the specimen from four directions, including four sets of frames, each acquired from a respective direction. Each set includes two frames: frames 1 and 5 acquired from a first direction (e.g., from left to right), frames 2 and 6 acquired from a second direction (e.g., from right to left), frames 3 and 7 acquired from a third direction (e.g., from top to bottom), and frames 4 and 8 acquired from a fourth direction (e.g., from bottom to top). Apparently, the four directions include two pairs of opposite directions.

Similarly, as described above with reference to FIG. 5, a determination can be made whether to perform the first registration 510, and, based on the result of determination, the two frames from each set can be either first registered and then combined, or just combined to generate the composite frame for the given direction. Therefore, four composite frames 602, 604, 606 and 608 can be generated.

Since there are two pairs of opposite directions, the second registration among the four composite images can be performed in two steps, 525 and 530. First, for each pair of opposite directions, the two first composite frames corresponding to the two opposite directions in the pair are registered first, and the registered two first composite frames are combined to obtain a composite frame. For instance, the composite frames 602 and 604 which correspond to the opposite directions of left to right and right to left are registered and combined (525) to generate a composite frame 610. Similarly, the other two composite frames 606 and 608 are registered and combined (525) to generate a composite frame 612. Therefore, two composite frames are generated corresponding to the two pairs of opposite directions. The two composite frames 610 and 612 are then registered and combined (530) to generate the image 614 of the semiconductor specimen.

According to certain embodiments, the image generation process as described above with reference to FIGS. 2A, 2B and FIG. 3 can be included as part of an examination recipe usable by system 101 and/or the examination tools 120 for examination of a specimen in runtime, such as, e.g., performing metrology operations with respect to the specimen. In such cases, the presently disclosed subject matter also includes a system and method for generating an examination recipe during a recipe setup phase, where the recipe comprises the steps as described with reference to FIGS. 2A, 2B and FIG. 3 (and various embodiments thereof). It is to be noted that the term "examination recipe" should be expansively construed to cover any recipe that can be used by an examination tool for performing operations related to any kind of examination as described above.

It is to be noted that examples illustrated in the present disclosure, such as, e.g., frames acquired from specific exemplified directions, the registration algorithms, the pattern matching algorithms, and the listed physical effects as described above, etc., are illustrated for exemplary purposes, and should not be regarded as limiting the present disclosure in any way. Other examples can be used in addition to, or in lieu of the above.

Among advantages of certain embodiments of the image generation process as described herein is to provide images of the specimen which possess reduced image artifacts (e.g., the image artifacts caused by non-uniform charging of the specimen when being scanned from one direction). Such generated images, when being used for examination of the semiconductor specimen, such as, e.g., CD measurements, can provide better results with higher accuracy.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

What is claimed is:

1. A computerized system of examination of a semiconductor specimen, the system comprising a processing and memory circuitry (PMC) configured to:
obtain a sequence of frames of an area of the semiconductor specimen, the sequence of frames being acquired by an electron beam tool configured to scan the area from a plurality of directions, the sequence of frames comprising a plurality of sets of frames wherein each set of frames is acquired from a respective direction; and
register the plurality of sets of frames and generate an image of the semiconductor specimen based on result of the registration, comprising:
in response to a determination of performing a first registration among the set of frames acquired from each direction, performing, for each direction, the first registration among the set of frames acquired therefrom and combining the registered set of frames to generate a first composite frame, thereby giving rise to a plurality of first composite frames respectively corresponding to the plurality of directions; and
performing a second registration among the plurality of first composite frames and combining the registered plurality of first composite frames to generate the image of the area of the semiconductor specimen, wherein the second registration is performed to correct offset between the plurality of first composite frames, the offset caused by directional scanning from the plurality of directions and related to scanning mechanism of the electron beam tool;
wherein the generated image of the semiconductor specimen possesses reduced image artifacts with respect to a frame scanned from a given direction of the plurality of directions, and wherein the image is usable for examination of the semiconductor specimen.

2. A computerized system of examination of a semiconductor specimen, the system comprising a processing and memory circuitry (PMC) configured to: obtain a sequence of frames of an area of the semiconductor specimen, the sequence of frames being acquired by an electron beam tool configured to scan the area from a plurality of directions, the sequence of frames comprising a plurality of sets of frames wherein each set of frames is acquired from a respective direction and register the plurality of sets of frames and generate an image of the semiconductor specimen based on result of the registration, comprising: in response to a determination of not performing a first registration, for each direction, combining the set of frames acquired therefrom to generate a second composite frame, the re by giving rise to a plurality of second composite frames respectively corresponding to the plurality of directions; and performing a second registration among the plurality of second composite frames and combining the registered plurality of second composite frames to generate the image of the semiconductor specimen, wherein the second registration is performed to correct offset between a plurality of first composite frames, the offset caused by directional scanning from the plurality of directions and related to scanning mechanism of the electron beam tool; wherein the generated image of the semiconductor specimen possesses reduced image artifacts with respect to a frame scanned from a given direction of the plurality of directions, and wherein the image is usable for examination of the semiconductor specimen.

3. The computerized system according to claim 1, further comprising the electron beam tool.

4. The computerized system according to claim 1, wherein the sequence of frames is acquired by scanning the area sequentially from the plurality of directions, and obtaining one or more frames from each direction during every scanning.

5. The computerized system according to claim 3, wherein the electron beam tool is configured to compensate at least part of an offset between frames acquired from different directions by adjusting synchronization between a scanning process and an imaging process of the electron beam tool.

6. The computerized system according to claim 1, wherein the determination is based on at least one of the following factors: number of frames included in the set of frames, and a layer and/or material of the specimen to be examined.

7. The computerized system according to claim 1, wherein the first registration is performed to correct drifts between the set of frames acquired from each direction caused by one or more physical effects between electron beam of the electron beam tool and the semiconductor specimen.

8. The computerized system according to claim 7, wherein the one or more physical effects comprises thermal expansion, charging effect, and tool tolerance.

9. The computerized system according to claim 1, wherein the first registration comprises performing pattern matching between the set of frames using a normalized cross-correlation function.

10. The computerized system according to claim 9, wherein a search range used in a present frame during the pattern matching is based on at least one previous drift identified in at least one preceding frame of the present frame.

11. The computerized system according to claim 1, wherein a search direction used in a present frame during a pattern matching performed in the second registration, is based on a direction of scanning when acquiring the present frame.

12. The computerized system according to claim 1, wherein the plurality of directions comprise two or more pairs of opposite directions, and wherein the performing a second registration comprises:
for each given pair of opposite directions, registering two first composite frames corresponding to the opposite directions in the given pair, and combining the registered two first composite frames to obtain a composite frame, thereby giving rise to two or more composite frames corresponding to the two or more pairs of opposite directions; and
registering the two or more composite frames, and combining the registered two or more composite frames to generate the image of the semiconductor specimen.

13. A computerized method of examination of a semiconductor specimen, the method performed by a processing and memory circuitry (PMC) and comprising:
obtaining a sequence of frames of an area of the semiconductor specimen, the sequence of frames being acquired by an electron beam tool configured to scan the area from a plurality of directions, the sequence of frames comprising a plurality of sets of frames wherein each set of frames is acquired from a respective direction; and registering the plurality of sets of frames and generating an image of the semiconductor specimen based on result of the registration, comprising:

in response to a determination of performing a first registration among the set of frames acquired from each direction, performing, for each direction, the first registration among the set of frames acquired therefrom, and combining the registered set of frames to generate a first composite frame, thereby giving rise to a plurality of first composite frames respectively corresponding to the plurality of directions; and performing a second registration among the plurality of first composite frames and combining the registered plurality of first composite frames to generate the image of the area of the semiconductor specimen, wherein the second registration is performed to correct offset between the plurality of first composite frames, the offset caused by directional scanning from the plurality of directions and related to scanning mechanism of the electron beam tool;

wherein the generated image of the semiconductor specimen possesses reduced image artifacts with respect to a frame scanned from a given direction of the plurality of directions, and wherein the image is usable for examination of the semiconductor specimen.

14. A computerized method of examination of a semiconductor specimen, the method performed by a processing and memory circuitry (PMC) and comprising: obtaining a sequence of frames of an area of the semiconductor specimen, the sequence of frames being acquired by an electron beam tool configured to scan the area from a plurality of directions, the sequence of frames comprising a plurality of sets of frames wherein each set of frames is acquired from a respective direction; and registering the plurality of sets of frames and generating an image of the semiconductor specimen based on result of the registration, comprising: in response to a determination of not performing a first registration, for each direction, combining the set of frames acquired therefrom to generate a second composite frame, thereby giving rise to a plurality of second composite frames respectively corresponding to the plurality of directions; and performing a second registration among the plurality of second composite frames, and combining the registered plurality of second composite frames, to generate the image of the semiconductor specimen, wherein the second registration is performed to correct offset between a plurality of first composite frames, the offset caused by directional scanning from the plurality of directions and related to scanning mechanism of the electron beam tool; wherein the generated image of the semiconductor specimen possesses reduced image artifacts with respect to a frame scanned from a given direction of the plurality of directions, and wherein the image is usable for examination of the semiconductor specimen.

15. The computerized method according to claim 13, wherein the determination is based on at least one of the following factors: number of frames included in the set of frames, and a layer and/or material of the specimen to be examined.

16. The computerized method according to claim 13, wherein a search range used in a present frame during a pattern matching performed in the first registration is based on at least one previous drift identified in at least one preceding frame of the present frame.

17. The computerized method according to claim 13, wherein a search direction used in a present frame during a pattern matching performed in the second registration is based on a direction of scanning when acquiring the present frame.

18. The computerized method according to claim 13, wherein the plurality of directions comprise two or more pairs of opposite directions, and wherein the performing a second registration comprises:

for each given pair of opposite directions, registering two first composite frames corresponding to the opposite directions in the given pair, and combining the registered two first composite frames to obtain a composite frame, thereby giving rise to two or more composite frames corresponding to the two or more pairs of opposite directions; and registering the two or more composite frames and combining the registered two or more composite frames to generate the image of the semiconductor specimen.

19. A non-transitory computer readable storage medium tangibly embodying a program of instructions that, when executed by a computer, cause the computer to perform a method of examination of a semiconductor specimen, the method comprising:

obtaining a sequence of frames of an area of the semiconductor specimen, the sequence of frames being acquired by an electron beam tool configured to scan the area from a plurality of directions, the sequence of frames comprising a plurality of sets of frames wherein each set of frames is acquired from a respective direction; and registering the plurality of sets of frames and generating an image of the semiconductor specimen based on result of the registration, comprising:

in response to a determination of performing a first registration among the set of frames acquired from each direction, performing, for each direction, the first registration among the set of frames acquired therefrom, and combining the registered set of frames to generate a first composite frame, thereby giving rise to a plurality of first composite frames respectively corresponding to the plurality of directions; and performing a second registration among the plurality of first composite frames and combining the registered plurality of first composite frames to generate the image of the area of the semiconductor specimen, wherein the second registration is performed to correct offset between the plurality of first composite frames, the offset caused by directional scanning from the plurality of directions and related to scanning mechanism of the electron beam tool;

wherein the generated image of the semiconductor specimen possesses reduced image artifacts with respect to a frame scanned from a given direction of the plurality of directions, and wherein the image is usable for examination of the semiconductor specimen.

* * * * *